United States Patent [19]

Kleinberg

[11] Patent Number: 4,553,110
[45] Date of Patent: Nov. 12, 1985

[54] JFET REFLECTION OSCILLATOR
[75] Inventor: Leonard L. Kleinberg, Greenbelt, Md.
[73] Assignee: The United States of America as represented by the Administrator of the National Aeronautics and Space Administration, Washington, D.C.
[21] Appl. No.: 153,240
[22] Filed: May 27, 1980
[51] Int. Cl.⁴ .......................... H03B 5/12; H03B 5/36
[52] U.S. Cl. ........................ 331/116 FE; 331/117 FE
[58] Field of Search .................. 331/116 FE, 117 FE
[56] References Cited
U.S. PATENT DOCUMENTS
3,477,039 11/1969 Chan ............................. 331/116 FE

OTHER PUBLICATIONS

Garner, Jr., "Meet Mr. FET", Popular Electronics, Feb. 1967, pp. 47–53, 94.

Primary Examiner—Edward P. Westin
Attorney, Agent, or Firm—John O. Tresansky; John R. Manning; Ronald F. Sandler

[57] ABSTRACT

A high frequency oscillator circuit is provided using a low cost junction type field effect transistor ($T_1$) with a tuned circuit connected to its gate. The frequency of operation is determined by the tuned circuit and the capacitance reflected from the source to the gate. The transistor is matched to the frequency of operation so that this frequency falls within the roll-off portion of the transistor's transconductance verses frequency curve, preferably somewhat above the 3 db point in frequency. Phase shifting necessary to sustain oscillation occurs due to the operation of the transistor in the roll-off portion of the curve and the addition of a phase shifting network ($R_1$, $C_1$) at the source. The resulting oscillator is small, stable, linear and inexpensive.

11 Claims, 5 Drawing Figures

JFET REFLECTION OSCILLATOR

ORIGIN OF THE INVENTION

The invention described herein was made by an employee of the U.S. Government and may be manufactured and used by or for the Government of the United States of America or for governmental purposes without the payment of any royalties thereon or therefor.

DESCRIPTION

1. Technical Field

The invention relates generally to oscillators, and more particularly, to high frequency oscillators employing low cost field-effect transistors.

2. Background Art

There exists a substantial body of technology relating to electronic oscillators. Conventional circuit topology consists essentially of Colpitts, Hartley, Pierce and Miller type configurations or variations of these. The active component in these circuits is typically a bipolar or unipolar transistor or a vacuum tube. The passive circuitry normally consists of one or more lumped-constant L-C circuits or a quartz or ceramic crystal. These circuits are relatively difficult to tune, or have many parts and are large in size or are costly relative to performance.

Although oscillator circuits exist in the art employing field effect transistors, these circuits employ relatively expensive high frequency transistors which operate in the flat portion of their transconductance versus frequency curves. Such high frequency transistors are more expensive than those which operate at lower frequencies.

STATEMENT OF THE INVENTION

Accordingly, an object of the invention is to provide an oscillator having high stability.

A further object of the invention is to provide a low cost oscillator.

Another object of the invention is to provide an easily tuned oscillator

Still another object of the invention is to provide an oscillator exhibiting linear operation.

Another object of the invention is to provide an oscillator having few components and of small size.

A further object is to provide an oscillator capable of monolithic construction.

Yet another object of the invention is to provide an oscillator with low power consumption.

Still another object of the invention is to provide a high frequency oscillator employing a low cost field effect transistor.

Accordingly to the invention, these and other objects are obtained by a circuit having a junction type field effect transistor (JFET) operated in the depletion mode and somewhere in the roll-off portion of its frequency versus transconductance curve, typically where the transconductance exhibits close to a 90° phase shift, which is usually somewhat above the 3 db point in frequency. The gate of the transistor is connected to a resonating crystal, a conventional parallel L-C circuit or any other device which will tune at a given frequency. The tuned frequency of the tank circuit plus capacitance reflected from the source falls somewhere in the roll-off frequency range of the JFET used. The source is loaded with a parallel R-C circuit. When the frequency operating point of the JFET is selected to be where the source current is about 90° out of phase with the input voltage at the gate and the source capacitor produces an additional 90° of phase shift, a negative resistance and a capacitance are reflected back from the source to the gate, whereupon positive feedback occurs which sets the condition for oscillation.

Still other objects and advantages of the invention will become readily apparent to those skilled in this art from the following detailed description, wherein is disclosed various preferred embodiments of the invention and the best mode contemplated for carrying out the invention.

DETAILED DESCRIPTION OF THE INVENTION

Figure 1:
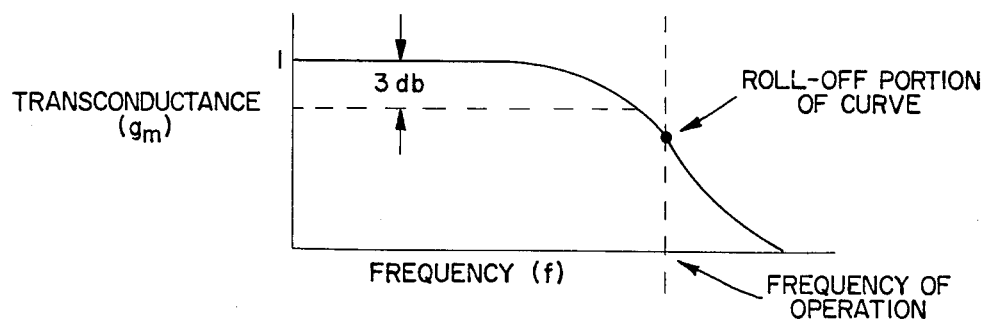
FIG. 1 is a typical transconductance versus frequency curve for the JFET employed in the invention.

Referring to the drawings wherein like reference designations identify identical parts throughout the several figures, FIG. 1 depicts a typical transconductance versus frequency output curve for a JFET. Accordingly to this invention, the JFET employed in the oscillator circuits have a frequency of operation in the roll-off portion of the curve. The best results are achieved when the operating point is somewhere above the 3 db point in frequency where the transconductance, i.e., current in the source, is about 90° out of phase with the gate voltage signal.

Figure 2:
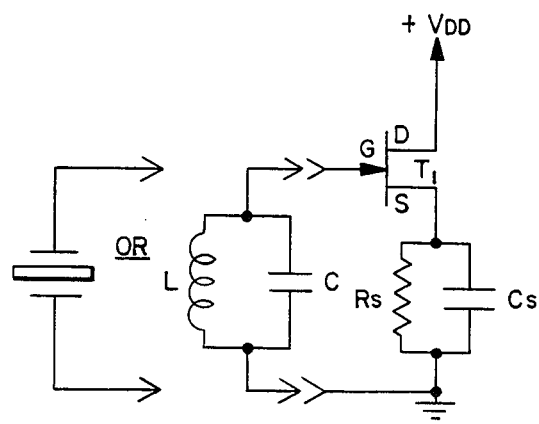
FIG. 2 is a schematic diagram illustrating the fundamental principals of operation of the invention.

The circuit depicted in FIG. 2 is illustrative of the principle of operation of the invention. A junction type field effect type transistor $T_1$, with drain (D), source (S), and gate (G) is connected to operate in the depletion mode. The drain is connected to the positive terminal of a direct current power supply, designated as $+V_{DD}$, the negative terminal of which is connected to a point of reference potential, such as ground. The source is connected to ground through a resistor $R_s$, which sets the bias. Either an L-C task circuit or a ceramic or quartz crystal is connected between the gate and ground. The roll-off frequency of the JFET is matched to the resonant frequency of the crystal or tank circuit plus capacitance reflected from the source to the gate. Operation of the JFET on the roll-off portion somewhat above the 3 db point in frequency will produce a transconductance with approximately a 90° phase shift with respect to the gate voltage. The magnitude of capacitor $C_s$ is selected to produce an additional 90° of phase shift with respect to an input signal at the gate. The total phase shift of 180° provides positive feedback. In terms of an equivalent circuit, a negative resistance and capacitance are reflected back to the gate thereby resulting in a total equivalent circuit in the gate of primarily an inductance, a capacitance, a resistance and a negative resistance, all in parallel with a power gain greater than one, thereby producing an infinite Q which satisfies the conditions for oscillation.

The operation of a JFET in the roll-off region may also be viewed by analyzing its gate input admittance which can be represented by the following expression:

$$Yin = \frac{1}{-R_G} + J\omega C_G,$$

where

Yin = admittance seen at the gate produced by the capacitance at the source;

$-R_G$ = negative resistance appearing from the gate to ground; and $+J\omega C_G$ = capacitive admittance appearing from the gate to ground A circuit containing a JFET operated in the roll-off region can be made to oscillate when a positive resistance equal to the negative resistance at the gate is inserted between the gate and ground as long as an inductance is also provided. The inductance may be provided by a vibrating crystal, a lumped constant inductor or a circuit that otherwise operates as an inductance. A JFET, therefore, can be made to oscillate at a frequency within the roll-off region when parallel resistance and inductance is added. A crystal is preferable when stability of the oscillating frequency is required. Tuning is typically accomplished by adding a variable capacitance in parallel with the resistance and inductance.

Figure 3:
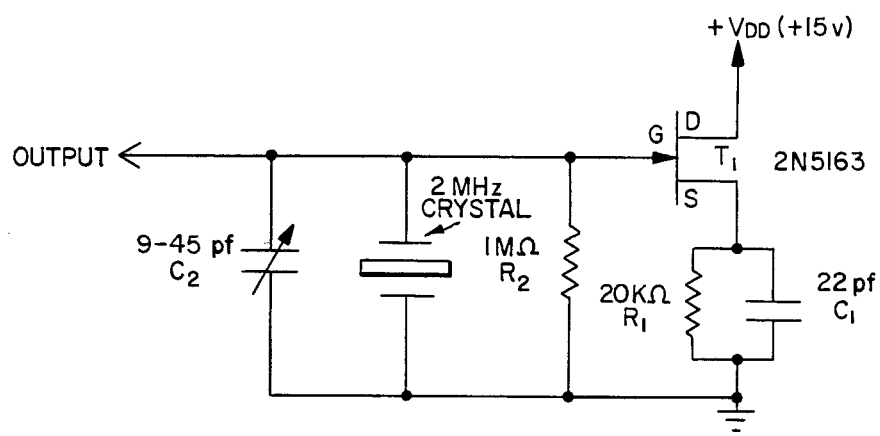
FIG. 3 is a schematic diagram illustrating an operational embodiment of the invention.

An operational circuit according to the invention is shown in FIG. 3 wherein $T_1$ is a 2N5163 JFET which is conventionally operated at the lower frequencies of the flat portion of its transconductance vs frequency curve. The drain of transistor $T_1$ is connected directly to a power supply, $+V_{DD}$, which is operating at 15 volts. The source of the JFET is connected to one end of parallel circuit resistance $R_1$ of 20K ohms, and a capacitor, $C_1$, of 22 pf, the other end of which is connected to ground. Resistor $R_1$ sets the biasing or quiescent current through the JFET, which, in turn, sets the frequency range of the circuit. Higher operational frequencies require larger currents. This operational characteristic is believed to be due to an increase in the $g_m$ of the device as the current increases. A variable capacitor $C_2$, in the range of 9 to 45 pf, connected between the gate and ground, provides for fine tuning. Alternatively, a variable capacitor may parallel capacitor $C_1$ to provide fine tuning. Additionally, a variable resistor in the 100K ohm to 200K ohm range (not shown) may be connected from the gate to ground instead of, or in addition to capacitor $C_2$ for tuning the circuit. The circuit can be easily tuned by any of these arrangements. A 2 MHz crystal is connected from the gate to ground to set the approximate frequency of operation of the circuit along with the capacitance reflected from the source. The 2N5163 JFET will operate in the roll-off region at this frequency. If stability is not a major objective, an L-C tank circuit may be employed instead of a crystal. A 1M ohm resistor, $R_2$, is also connected between the gate and ground, to provide a D.C. return or leakage path for the gate current when a crystal is employed.

The circuit illustrated in FIG. 3 was made to oscillate at a frequency of 2.0009255 MHz and did not vary more than a tenth of a cycle. The bias voltage was +5 V.D.C. at the source which indicated a D.C. current flow of about 0.25 ma. A 0.6 V peak to peak oscillating signal appeared at the source with a 1.8 V peak to peak oscillating signal appearing at the gate. The signals were sinusoidal and exhibited low distortion. The signal may be outputted from the source or the gate, the gate output being preferred.

Figure 4:
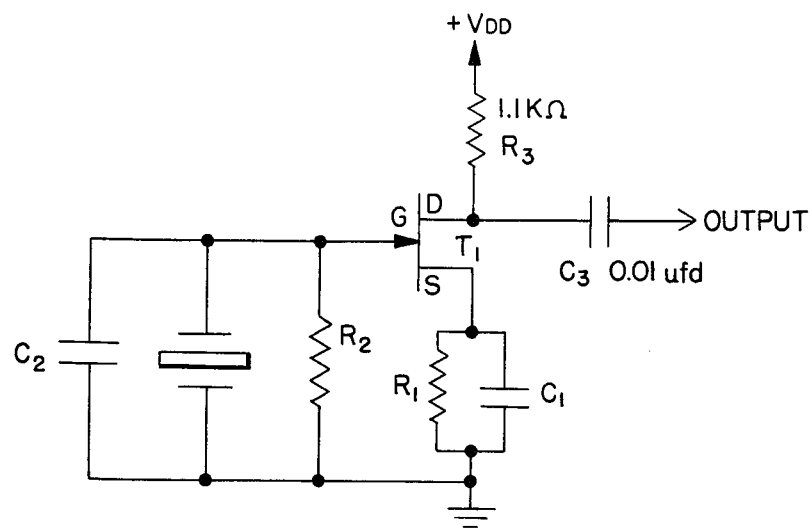
FIG. 4 is a schematic diagram illustrating an alternative operational embodiment of the invention.

FIG. 4 shows an alternative circuit which is essentially the same as that of FIG. 3 with the exception of the addition of 1.1K ohm load resistor $R_3$ and a coupling capacitor $C_3$ of 0.01 μfd at the drain. The addition of these components allows taking the output from the drain thereby to isolate the effect of loading the output on the frequency of operation. The value of resistor $R_3$ should not be so large as to effect the selected load line for the transistor operation. With resistor $R_3$ of a magnitude of 1.1K ohm, the operation of the circuit of FIG. 4 is essentially the same as that of FIG. 3.

The circuits employing the invention have a demonstrated capability of operating between 1 MHz and 50 MHz with available components, without the range constituting a theoretical limit. Short term frequency stability has been better than $10^8$ with the use of crystals and better than $10^6$ with the use of L-C tank circuits. Low power drain in the order of 3.75 mw has been achieved. Low cost has been achieved because of circuit simplicity, the use of few components and the use of relatively inexpensive, low frequency JFETs considering the frequency of operation. Circuit simplicity also allows for ease of monolithic construction. The only components external to the chip would be the crystal or coil and variable tuning components.

Figure 5:
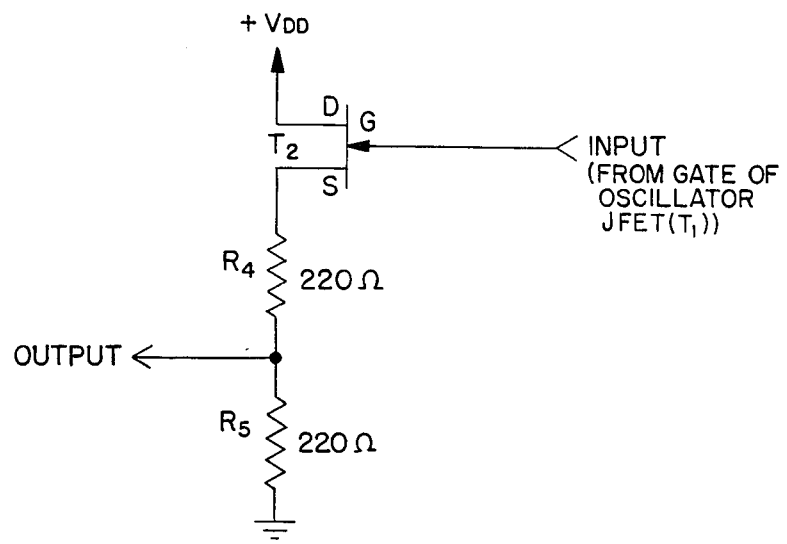
FIG. 5 is a schematic diagram of a buffer circuit which may be employed with the invention.

Another alternative arrangement to avoid loading of the oscillator is to add a buffer circuit. The buffer may be placed with its input at the source, drain or gate of the JFET depending on the particular application. FIG. 5 shows the input of the buffer connected to the gate of the JFET of the circuit of FIG. 3 to obtain a large signal with low-distortion. In this buffer, $T_2$ is a J 110 JFET with its drain connected to a +15 V D.C. power supply designated as $+V_{DD}$ and its source connected to resistors $R_4$ and $R_5$, in series to ground, both of which are 220 ohm resistances. The output is taken from the juncture of the resistors. The gate operates at about ground and the source is biased at about 4 V D.C., resulting in a source current of about 9 ma. The split resistance output further reduces the variations due to loading but at the expense of gain.

The operating characteristics of the invention, especially in terms of frequency range, stability, linearity and low power drain, renders the invention particularly suitable for use in communications receivers and transmitters and in digital systems such as computers, microprocessors and digital displays.

There has been disclosed preferred embodiments of the invention, but it is to be understood that the invention is capable of use in various combinations and environments and is capable of changes and modifications within the scope of the inventive concept as disclosed and claimed.

I claim:

1. An oscillator comprising:
   a junction type field effect transistor having a source, a drain and a gate, said transistor being selected to be operational at a frequency within the roll-off portion of its transconductance versus frequency curve;
   resonant means conjoining with the reflected capacitance appearing at said gate for determining the frequency of oscillation of said transistor within said roll-off portion thereby shifting the source current out-of-phase with the signal on the gate; and circuit means for further shifting the source current out-of-phase with said gate signal thereby creating positive feedback with respect to said gate signal to sustain the oscillation.

2. The oscillator of claim 1 wherein said frequency of operation is somewhat above the 3 db point in frequency of said curve.

3. The oscillator of claim 1 wherein said resonant means is an L-C network connected to said gate.

4. The oscillator of claim 1 wherein said resonant means is a crystal connected to said gate.

5. The oscillator of claim 1 wherein said circuit means is an R-C network connected to said source.

6. An oscillator circuit comprising:

a network including a resistor in parallel with a capacitor;

a field effect transistor having a source, a drain and a gate, said source being connectable to one side of a power supply through said network and said drain being connectable to the other side of the power supply;

a tuned circuit connected to said gate; and said field effect transistor operating in the roll-off portion of its transconductance versus frequency curve, its operating point frequency on said curve being established by said tuned circuit and capacitance reflected from the source to the gate.

7. The circuit of claim 6 wherein said field effect transistor is of the junction type.

8. The circuit of claim 6 wherein a second resistor is provided and said drain is connectable to said other side of said power supply through said second resistor.

9. The circuit of claim 6 wherein said tuned circuit comprises a crystal.

10. The circuit of claim 6 wherein said tuned circuit comprises a parallel L-C tank network.

11. The circuit of claim 6 wherein said operating point frequency is above the 3 db down level for transconductance.

* * * * *